United States Patent [19]

Takigami et al.

[11] 4,358,785

[45] Nov. 9, 1982

[54] COMPRESSION TYPE SEMICONDUCTOR DEVICE

[75] Inventors: Katsuhiko Takigami; Makoto Azuma, both of Yokohama, Japan

[73] Assignee: Tokyo Shibaura Denki Kabushiki Kaisha, Japan

[21] Appl. No.: 127,092

[22] Filed: Mar. 4, 1980

[30] Foreign Application Priority Data

Mar. 13, 1979 [JP] Japan ................................. 54-28286

[51] Int. Cl.³ .............................................. H01L 23/42
[52] U.S. Cl. ......................................... 357/79; 357/68
[58] Field of Search .................................... 357/79, 68

[56] References Cited

U.S. PATENT DOCUMENTS 3,772,764 11/1973 Furnwal ........................... 357/79 X
3,991,461 11/1976 Anderson ......................... 357/79 X
4,100,566 7/1978 Okikawa .......................... 357/79 X

*Primary Examiner*—Martin H. Edlow
*Attorney, Agent, or Firm*—Finnegan, Henderson, Farabow, Garrett & Dunner

[57] ABSTRACT

A compression type semiconductor device includes a semiconductor element; at least one metal plate having substantially upright edge surfaces, a planar contacting surface engaging a first surface of the semiconductor element and a continuous curved surface interconnecting the edge surfaces and the contacting surface; and a means for pressing the contacting surface of the metal plate against the first surface of the semiconductor element. The continuous curved surface of the metal plate is so formed that at each point on the periphery of the contacting surface at least one plane normal to the contacting surface intersects the curved surface in an arcuate curve which tangentially joins the contacting surface.

11 Claims, 19 Drawing Figures

FIG. 8
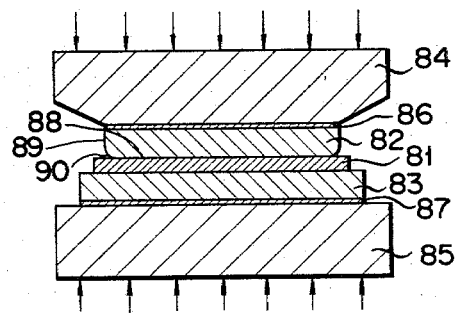
FIG. 9A
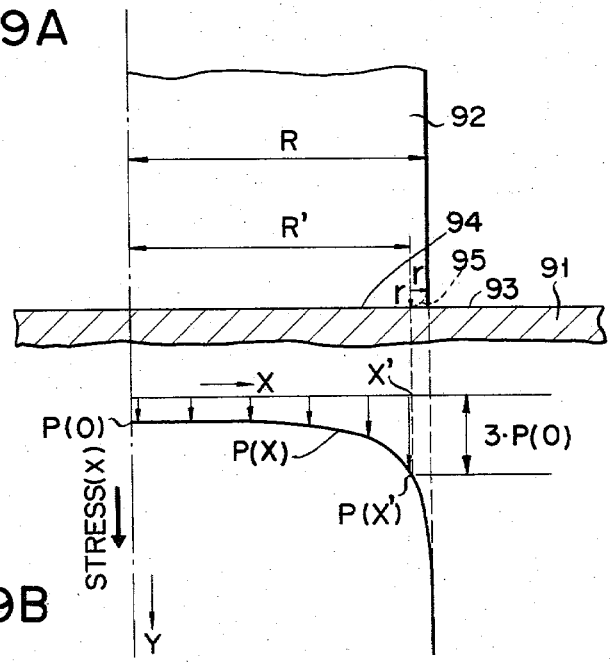
FIG. 9B

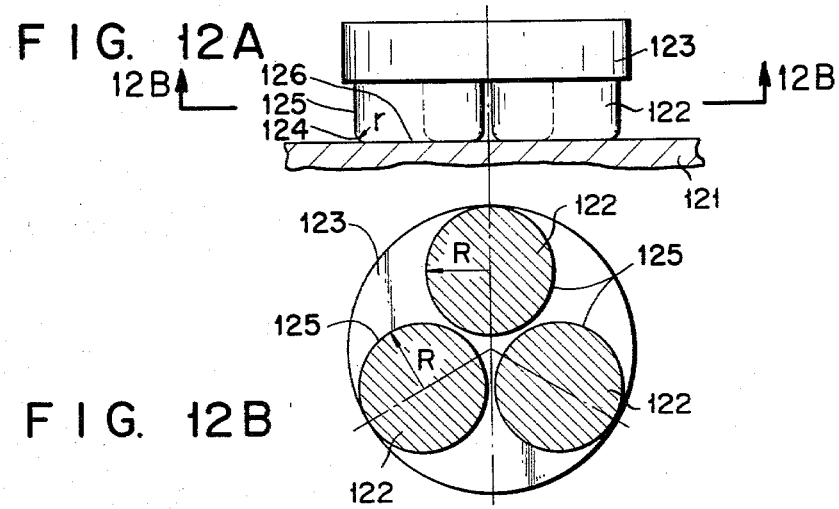
FIG. 12A
FIG. 12B
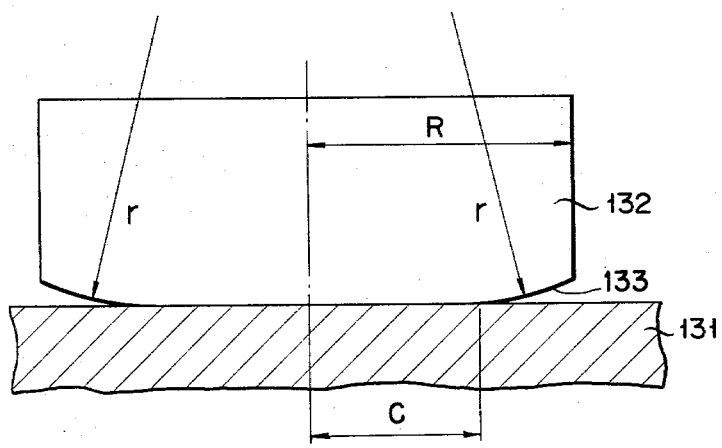
FIG. 13

COMPRESSION TYPE SEMICONDUCTOR DEVICE

BACKGROUND OF THE INVENTION

This invention relates to a compression-type semiconductor device in which such semiconductor elements as transistors, thyristors and gate turn-off thyristors are maintained in a compressed state.

Compression-type semiconductor devices having such semiconductor elements as transistors, thyristors and gate turn-off (GTO) thyristors which are maintained in compressed states are widely known as power devices. FIG. 1 shows the general construction of a semiconductor device of this type. Columnar metal stamps 14, 15 composed of a material such as copper having high thermal and electrical conductivity are disposed on both sides of a semiconductor element 11. Metal plate 12 is interposed between semiconductor element 11 and metal stamp 14, and metal plate 13 is interposed between semiconductor element 11 and metal stamp 15. As denoted by the arrows in FIG. 1 the semiconductor element 11 is compressed between metal plates 12, 13 by the metal stamps 14, 15. The thermal expansion coefficient of semiconductor element 11 generally differs from that of metal stamps 14, 15; so that there were metal stamps 14, 15 in direct contact with the semiconductor element 11, the temperature change accompanying the operation of the semiconductor device would result in a bimetal effect causing mechanical stress to be exerted on semiconductor element 11. In order to prevent this bimetal effect, the metal plates 12, 13 are formed of a material having a thermal expansion coefficient intermediate those of the semiconductor element 11 and metal stamps 14, 15. In general, materials such as molybdenum and tungsten which have thermal expansion coefficients close to that of the semiconductor element 11 are used for metal plates 12, 13. Where, for example, semiconductor element 11 is a thyristor having an anode electrode on one surface thereof and a cathode electrode on the opposite surface therefrom, one surface of metal plate 13 is directly bonded by an alloying method to the surface of semiconductor element 11 which contains the thyristor anode electrode. The other surface of plate 13 is bonded to the metal stamp 15 with a solder layer 17. One surface of metal plate 12 is bonded to metal stamp 14 with a solder layer 16, while the other surface thereof is pressed against the surface of semiconductor element 11 which contains cathode electrode.

FIG. 2 illustrates a conventional semiconductor power elements such as a thyristor or diode, having a cathode electrode 21 and a gate electrode 22. As shown, cathode electrode 21 is substantially an electrically integral structure. Therefore, no serious change in electrical properties is brought about if the semiconductor element is compressed somewhat unevenly.

However, in a majority of the semiconductor elements, which have recently attracted attention in this field, such as high power transistors and GTO thyristors, a cathode region 31 (or emitter region) is divided into a plurality of mesa portions, as shown in FIG. 3A. Separate electrodes (not shown) formed on each separate section of the cathode region 31 are pressed into contact with a metal plate disposed within a region 32 denoted by a dashed line. Where the semiconductor element is a GTO thyristor, the divided sections of the cathode region 31 are allowed to operate simultaneously as independent GTO thyristors, thereby performing the gate turn-off function for a large current. Thus, it is absolutely necessary in this instance for the metal plate within region 32 to press uniformly upon each of the electrodes within cathode region 31. Otherwise, unevenness in the current distributed among the individual elements of cathode region 31 or unevenness in turn-off properties can result, due to partial contact or differences in contact resistance between some individual elements of cathode region 31 and the metal plate within region 32.

We have recognized that the compressed state of a semiconductor device of this type basically can be represented by the model of a rigid post (corresponding to the metal plate and metal stamp) pressed against a semi-infinitely elastic body (corresponding to the semiconductor element). Assume, for example, that a rigid post 42 is pressed against a semi-infinitely elastic body 41, as shown in FIG. 4A. In this case, the stress P(x) generated in elastic body 41 in a direction perpendicular to the contact plane is represented by formula (1) below according to the description found at page 45 of "Theory of Elastic Contact" by Garlin and page 1085 of "Handbook on Design of Strengh":

$$P(x) = \frac{q}{\pi \sqrt{R^2 - x^2}} \tag{1}$$

where,
q = pressure applied to the rigid post 42,
R = radius of the rigid post 42, and
x = distance from the center of the rigid post 42.

In FIG. 4B which graphically depicts formula (1) it can be seen that the stress generated in the semi-infinitely elastic body 41 gradually increases toward the periphery of rigid post 42, reaching infinity in the region contacting the periphery of the rigid post. This suggests that the stress tends to concentrate in the peripheral portion of the semiconductor element in compression-type semiconductor devices. As a matter of fact, GTO thyristor devices damaged during operation have been examined, and in the majority of devices, a circular impression along the dotted line 32 of FIG. 3A was found. Also, a marked reduction in the maximum operational anode (or controllable) current occured in GTO thyristor devices bearing such circular impressions. It is believed that the uneven stress distribution shown in FIG. 4B gives rise to unevenness in the planar distribution of anode current, bringing about a reduction in the maximum operational anode current mentioned above. In addition, in GTO thyristor devices bearing such circular impressions, peripheral portions of the cathode electrode are forced radially outward, due to thermal fatigue during operation, with the result that the cathode electrode directly contacts the gate electrode, short circuiting the device.

In order to overcome the difficulties described above, it has been suggested that unevenness of stress distribution could be moderated by providing a metal stamp 51 with a recess 51a as shown in FIG. 5. In this case, however, the deformation of a metal plate 52 disposed between the metal stamp 51 and a semiconductor element (not shown) varies with the thickness of the metal plate 52, failing thereby to provide a consistently reliable solution to the problem of uneven stress distribution.

It has also been proposed, as shown in FIG. 6, to cut at an acute angle θ the periphery 62a of the side of a metal plate 62 which contacts semiconductor element 61. The cutting angle θ which is determined arbitrarily, is customarily 30° or more. In general, the metal plate 62 is about 500 to 1000 μm thick, and the cut portion at the periphery 62a of the metal plate 62 has a height of about 100 to 300 μm. Nevertheless, because the cathode region of the semiconductor element 61 is only about 10 to 30 μm high, as seen in FIG. 6, cutting the periphery 62a of the metal plate 62 at angle θ only shifts the periphery of contact between the semiconductor element 61 and metal plate 62 from point P radially inward to point Q, which does not significantly eliminate uneven stress distribution.

Therefore, solving the problem of uneven stress distribution in a compression-type semiconductor element remains a matter of serious concern.

SUMMARY OF THE INVENTION

An object of this invention, therefore, is to provide a compression-type semiconductor device having a semiconductor element free from stress concentration on the periphery thereof and being relatively uniformly compressed throughout.

According to this invention, there is provided a compression-type semiconductor device, comprising:
a semiconductor element;
at least one metal plate having substantially upright edge surfaces, a planar contacting surface engaging a first surface of the semiconductor element, and a continuous curved surface interconnecting the edge surfaces and the contacting surface, wherein at each point on the periphery of the contacting surface at least one plane normal to the contacting surface intersects the curved surface in an arcuate curve which tangentially joins the contacting surface; and
compression means including a metal stamp for pressing said contacting surface of said metal plate against said first surface of said semiconductor element;
wherein the metal plate has a thermal expansion coefficient intermediate those of the semiconductor element and the metal stamp.

In general, the metal stamp has a thermal expansion coefficient 5 to 7 times that of the semiconductor element, which is generally silicon, and the metal plate has a thermal expansion coefficient 2 to 4 times that of the semiconductor.

BRIEF DESCRIPTION OF THE DRAWINGS

FIG. 8 is a cross-sectional view showing a compression-type semiconductor device according to one embodiment of the present invention;

FIG. 9A shows the right-hand half of a system in which a semi-infinitely elastic body, an idealized representation of a semiconductor element, compressed by a rigid post, representing the combination of a metal stamp and a metal plate having a curved surface as provided for in this invention;

FIG. 9B is a graph showing the stress distribution within the semi-infinitely elastic body under the condition of FIG. 9A;

FIGS. 11A to 13 show additional embodiments of this invention.

DETAILED DESCRIPTION OF THE INVENTION

First, the principle of the invention will be described below.

Figure 7A:
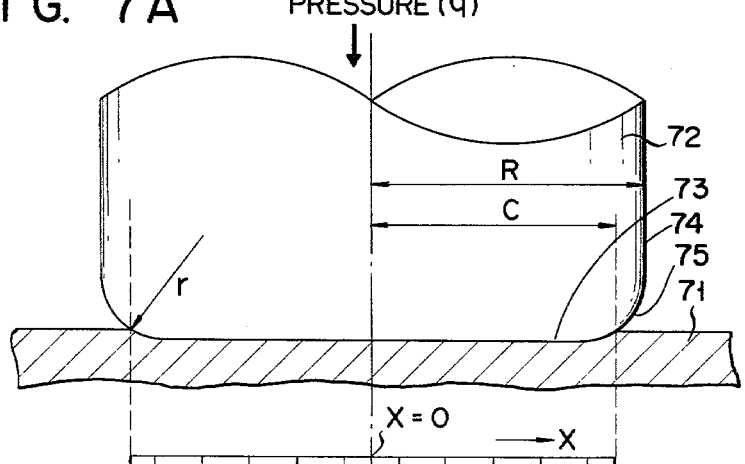
FIG. 7A shows a semi-infinitely elastic body, an idealized representation of a semiconductor element, compressed by a rigid post, representing a metal stamp and a metal plate.

In a compression-type semiconductor device of the present invention, a metal plate is provided having substantially upright side surfaces, a planar contacting surface for engaging a semiconductor element, and a continuous curved surface interconnecting the edge surfaces and the contacting surface. At each point on the periphery of the contacting surface at least one plane normal to the contacting surface intersects the curved surface in an arcuate curve which tangentially joins the contacting surface at each such peripheral point of the contacting surface. FIG. 7A shows a columnar rigid post 72 of radius R (corresponding to the combination of the metal plate and metal stamp specified in this invention) pressed against a semi-infinitely elastic body 71 (corresponding to a semiconductor element). Rigid post 72 has a substantially upright edge surface 74, a planar contacting surface 73 for engaging the upper surface of the semi-infinitely elastic body 71, and a continuous curved surface 75 interconnecting edge surface 74 and contacting surface 73. Curved surface 75 is so formed that at least one plane normal to contacting surface 73 at each point on the periphery thereof intersects curved surface 75 in an arcuate curve which tangentially joins contacting surface 73. In this example, the stress P(x) existing in semi-infinitely elastic body 71 due to compression by post 72 is expressed by the following formula:

$$P(x) = \frac{4q}{3\pi C^4}\left[(C^2 + 2x^2)\sqrt{C^2 - x^2}\right] \quad (2)$$

where,
q = pressure applied through post 72 to semi-infinite elastic body 71,
C = radius of the circular area in which the semi-infinitely elastic body 71 and the rigid post 72 are in substantial contact, and
x = distance from the center of the rigid post 72.

Figure 7B:
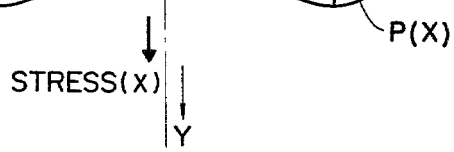
FIG. 7B is a graph showing the stress distribution within the semi-infinitely elastic body under the condition of FIG. 7A.

In FIG. 7B, which graphically depicts formula (2), it can be seen that the radius R of the rigid post 72 is irrelevant to the distribution of stress P(x) existing within semi-infinitely elastic body 71. Any stress existing within elastic body 71 is limited to the area within which rigid post 72 is in substantial contact with elastic body 71, i.e., a circular area having radius C<R. The stress existing in the peripheral portion of the area of contact between the semi-infinitely elastic body 71 and post 72 is less than twice the value of the stress existing in the central portion. In other words, when the periphery of contacting surface 73 is curved as shown, the stress resulting within semi-infinitely elastic body 71 is distributed with relative uniformity and without giving rise to extremely high stress in peripheral portions. It is desirable that the peripheral portion of contacting surface 73 be curved such that the radius R of the metal plate is only slightly larger than the radius C of the circular contact area between the metal plate and the semiconductor element 71, thereby to maintain high thermal conductivity, to prevent current unevenness from differences in contact resistance, to facilitate processing of the metal plate engaging semiconductor element 71, and to suppress lateral enlargement of any semiconductor device in semiconductor element 71.

Embodiments employing the principle of the present invention will now be described.

Figure 1:
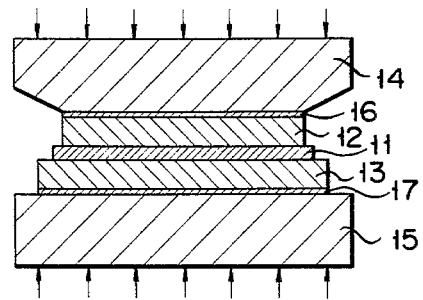
FIG. 1 is a cross-sectional view showing a conventional compression-type semiconductor device.
Figure 2:
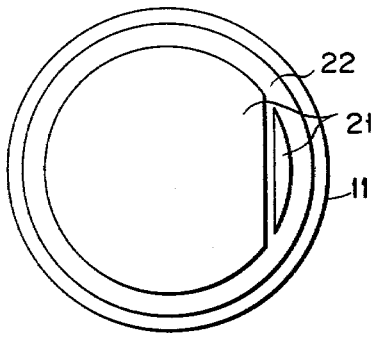
FIG. 2 is a plan view showing the cathode electrode and gate electrode of a conventional thyristor.
Figure 3A:
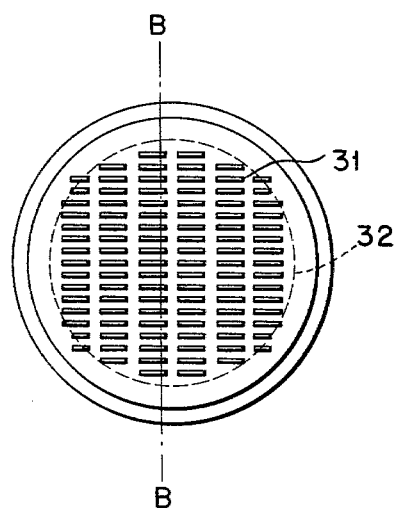
FIG. 3A is a plan view showing the cathode region of a GTO thyristor device.
Figure 3B:
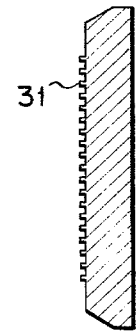
FIG. 3B is a cross-sectional view along line B—B of FIG. 3A.
Figures 4A, 4B:
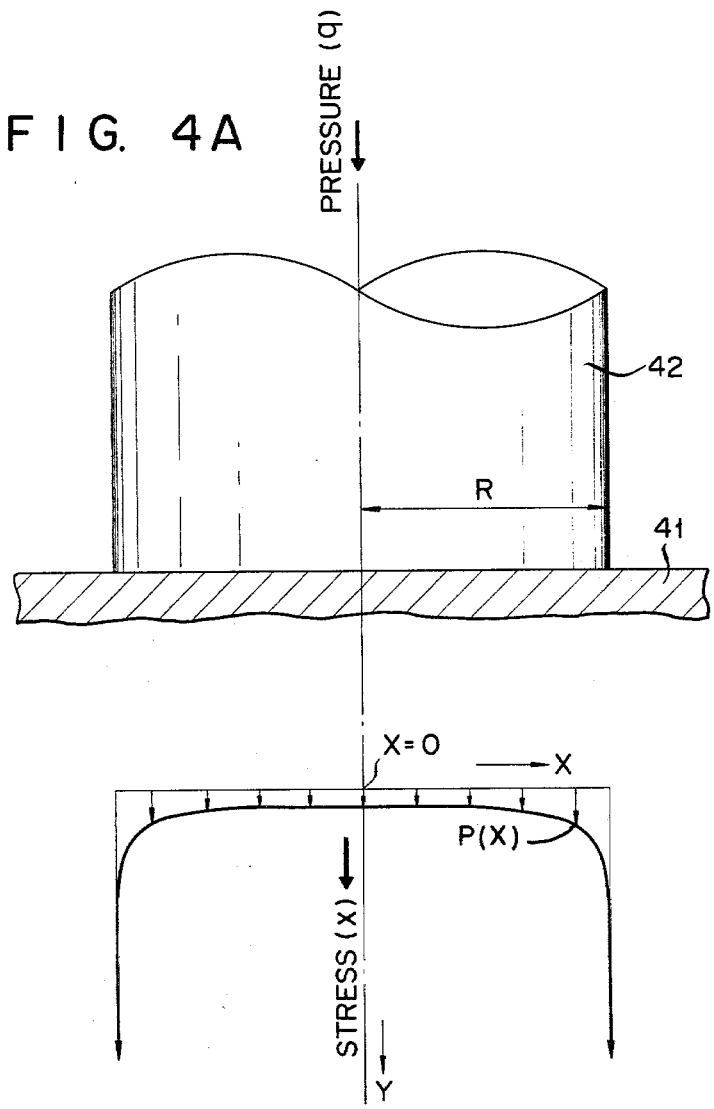
FIG. 4A shows a semi-infinitely elastic body, an idealized representation of a semiconductor element, compressed by a rigid post, representing a metal plate and metal stamp.
FIG. 4B is a graph showing the stress distribution within the semi-infinitely elastic body under the condition of FIG. 4A.
Figure 5:
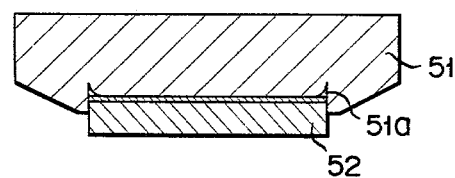
FIGS. 5 and 6 are cross-sectional views showing other types of conventional compression-type semiconductor devices.
Figure 6:
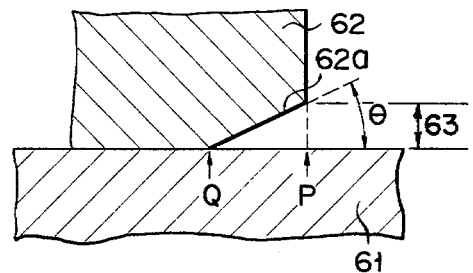

A compression type semiconductor device as shown in FIG. 8 includes as a semiconductor element a GTO thyristor 81 of P-N-P-N structure, which is produced by an ordinary diffusion technique. The uppermost N-type layer of thyristor 81 which constitutes a cathode region, is divided into a plurality of mesas 31, as shown in FIGS. 3A and 3B. Electrodes (not shown) are mounted to each of the cathode region, the anode region, and the intermediate P-type layer.

One surface of a tungsten disk plate 83 larger in diameter than the GTO thyristor 81 is bonded directly by an alloying method to the side of GTO thyristor 81 containing the anode region thereof. A copper stamp 85 is secured to the other surface of the tungsten plate 83 by a solder layer 87. Contacting surface 88 of a molybdenum disk plate 82 smaller in diameter than the GTO thyristor 81 is bonded to the side thereof containing the cathode region by an alloying method. Contacting surface 88 is interconnected with the edge surface 89 of the molybdenum plate 82 by a continuous curved surface 90, which will be described below in detail. A copper stamp 84 is secured by a solder layer 86 to the other surface of the molybdenum plate 82. The copper stamps 84 and 85 are pressed in the directions denoted by the arrows to provide a compression-type GTO thyristor device. The GTO thyristor device of the construction described above has the following advantages:

(1) Since the stress exerted on the GTO thyristor 81 is distributed with relative uniformity, the GTO thyristor is not subjected to excessive mechanical stress, resulting in improved reliability in the GTO thyristor.
(2) Since the stress distribution in GTO thyristor 81 is relatively uniform, no appreciable difference arises in electric properties of the divided sections of the cathode region 31 of FIG. 3, rendering it possible to prevent electrical deterioration of the GTO thyristor device.
(3) Short circuits between the gate electrode and the cathode electrode of GTO thyristor 81 are prevented.

The above-noted merits result also if the GTO thyristor 81 is replaced, for example, by a transistor, a thyristor, or a diode.

In the embodiment of the invention shown in FIG. 8, continuous curved surface 90 of molybdenum plate 82 is a convex surface which tangentially joins contacting surface 94. In other words, if the periphery of contacting surface 88 is the set of points P common to contacting surface 88 and to curved surface 90, at each such point P there is at least one plane normal to contacting surface 88 which intersects curved surface 90 in a curve having point P as an end point and having the property that the tangent to the curve at point P is contained within the plane defined by contacting surface 88. The curve exhibiting these properties will be referred to hereafter as the cross section of curved surface 90. FIGS. 9A and 9B together illustrate how to design curved surface 90 of this invention. We have experimentally confirmed that an appreciable change in electric properties is avoided if the maximum stress in the peripheral portion of the semiconductor element 81 is maintained at less than about 3 times the lowest value in the central portion of semiconductor element. In FIG. 9A semi-infinite elastic body 91 represents a GTO thyristor while rigid post 92 represents a metal plate of radius R. Rigid post 92 has substantially upright side surfaces 96, representing the edge of a metal plate, interconnected by a continuous curved surface 95 to contacting surface 94, which is shown engaging a surface 93 of semi-infinite elastic body 91. In FIG. 9B x is the lateral distance from the center of GTO thyristor 91 and P(x) is the stress created at x by the pressure of rigid post 92. P(o) represents the stress created in the center of the GTO thyristor 91 where x=o, and x' is the distance at which P(x')=3P(o). In this invention, curved surface 95 is constructed such that it meets the periphery of contacting surface 94 at point x' mentioned above and such that the intersection of curved surface 95, with at least one plane normal to contacting surface 88 at point x' is an arc of curvature radius r having point x' as one end point and having the property that the tangent to the arc at point x' is contained within the plane defined by contacting surface 88. As apparent from FIGS. 9A and 9B, the smallest curvature radius r' of the cross section of curved surface 90 which meets the requirement of this invention is equal to the difference between the radius R of rigid post 92 and the distance x' from the center of the GTO thyristor 91. Thus r'=R−x', and the allowable curvature radius r can be expressed by the general formula:

$$r \geq R\left(1 - \frac{2\sqrt{2}}{3}\right) \tag{3}$$

Figure 10:
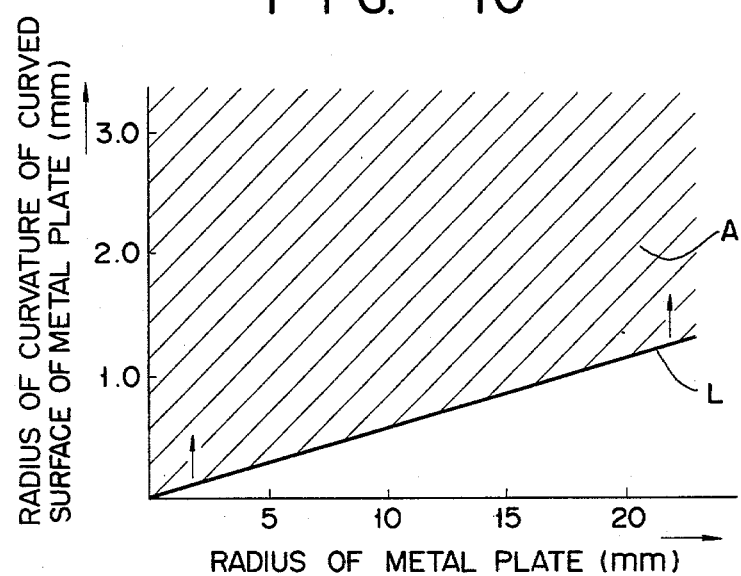
FIG. 10 is a graph showing the relationship in this invention between some of the dimensional parameters of a continuous curved surface of a metal plate.

FIG. 10 shows the relationship between the radius R of rigid post 92, representing a metal plate, and the allowable curvature radius r of the cross section of curved surface 95. The solid line L represents the lower limit of the allowable curvature radius r, thus the curvature radius of the curved surface interconnecting the peripheral portion of the contacting surface and edges of a metal plate in a compression-type semiconductor should fall within the hatched region A above solid line L of FIG. 10.

Figure 11A:
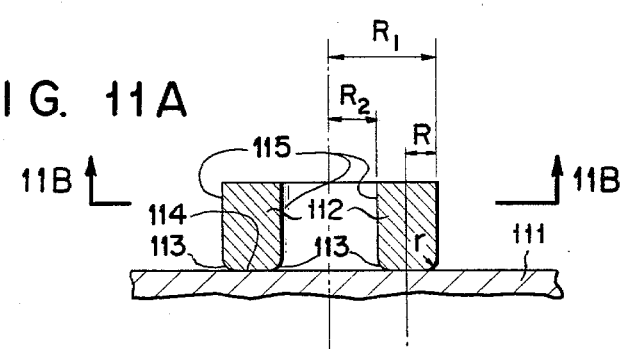
Figure 11B:
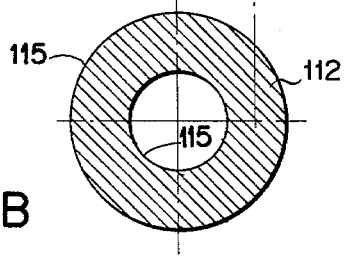

FIGS. 11 to 13 show additional embodiments of the invention. In FIGS. 11A and 11B, a semiconductor element 111 is compressed by an annular-shaped metal plate 112. In this case, the difference between the outer radius $R_1$ and inner radius $R_2$ of the annular-shaped metal plate 112 is divided by two to arrive at the value of the parameter R to which the relationship of FIG. 10 is applied for determining the curvature radius r of the cross section of continuous curved surfaces 113 which interconnects the periphery of contacting surface 114 and the edge surfaces 115 of plate 112.

In FIGS. 12A and 12B, a semiconductor element 121 is compressed by a plurality of divided sections 122 of a metal plate 123. In this case, the curvature radius r of the cross section of continuous curved surfaces 124 which interconnects the periphery of contacting surfaces 126 and edge surfaces 125 is determined based on the assumption that each of the divided sections 122 constitutes an independent metal plate.

Further, FIG. 13 shows that the curvature radius r of the cross section of curved surface 133 may be larger than the radius R of a metal plate 132. In this case, the radius C of the circular contact area between the metal plate 132 and a semiconductor element 131 is markedly smaller than the radius R of the metal plate 132, as apparent from the drawing and, thus, is not so efficient. However, the embodiment of FIG. 13 satisfies the relationship between R and r specified in FIG. 10 and, thus, is included within the scope of this invention which covers even the case where $R \leq r$.

In the ;embodiment of FIG. 8, the molybdenum plate 82 is circular; however, it is possible to use a rectangular molybdenum plate. In such a case, the curvature radius r of the curved portion of the molybdenum plate should meet the relationship, $r \geq R(1 - 2\sqrt{2}/3)$, where R is equal to half the length of the shorter side of the rectangular molybdenum plate.

As apparent from the foregoing description, the useful effect of this invention is most prominent where the metal plate is smaller than the semiconductor element. Thus, if the tungsten plate 83 shown in FIG. 8 is made smaller than the GTO thyristor 81, the plate 83 should also be provided with a continuous curved surface interconnecting the contacting surface and edge surfaces of plate 83 in the manner of this invention.

In each of the embodiments described herein, a metal plate is bonded directly to a semiconductor element. But, it is possible, for example, to form a thin film of aluminum or molybdenum between the metal plate and the semiconductor element. In such a case, the film should be thin enough to not reduce the desireable effect produced by the continuous curved surface of the metal plate.

What we claim is:

1. A compression type semiconductor device, comprising:
    a semiconductor element;
    at least one metal plate having substantially upright edge surfaces, a planar contacting surface engaging a first surface of the semiconductor element, and a continuous curved surface interconnecting said edge surfaces and said contacting surface, wherein at each point on the periphery of said contacting surface at least one plane normal to said contacting surface intersects said curved surface in an arcuate curve which tangentially joins said contacting surface; and
    compression means including a metal stamp for pressing said contacting surface of said metal plate against said first suface of said semiconductor element;
        wherein the metal plate has a thermal expansion coefficient intermediate those of the semiconductor element and the metal stamp.
2. The device according to claim 1, wherein the metal plate is a disk.
3. The device according to claim 2, wherein said disk has radius R, and said arcuate curve is an arc having radius r such that $r \geq R(1 - 2\sqrt{2}/3)$.
4. The device according to claim 1, wherein the metal plate is a rectangle.
5. The device according to claim 4, wherein half the length of the shorter side of said rectangle is R, and said arcuate curve is an arc having radius r such that $r \geq R(1 - 2\sqrt{2}/3)$.
6. The device according to claim 1, wherein the metal plate is an annulus.
7. The device according to claim 6, wherein half the difference between the outer and inner radii of said annulus is R, and said arcuate curve is an arc having radius r such that $r \geq R(1 - 2\sqrt{2}/3)$.
8. The device according to any one of claims 1 to 7, wherein the semiconductor element is a gate turn-off thyristor having a cathode electrode formed on a first side thereof and the metal plate is provided on said first side of said gate turn-off thyristor.
9. The device according to any one of claims 1 to 7, wherein the metal plate is formed of a metal from the group consisting of molybdenum and tungsten.
10. The device according to any one of claims 1 to 7, also including a solder layer between the metal plate and the metal stamp.
11. The device according to any one of claims 1 to 7, also including a thin metal film between the semiconductor element and the metal plate.

* * * * *